United States Patent
Li et al.

(10) Patent No.: US 12,469,714 B2
(45) Date of Patent: Nov. 11, 2025

(54) GATELINE MASK DESIGN FOR REMOVING SACRIFICIAL GATELINE POLYSILICON WITHIN STAIR STEP AREA

(71) Applicant: Yangtze Memory Technologies Co., Ltd., Hubei (CN)

(72) Inventors: Beibei Li, Hubei (CN); Wei Xu, Hubei (CN); Bin Yuan, Hubei (CN); Zongke Xu, Hubei (CN); XiangNing Wang, Hubei (CN); ZongLiang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 512 days.

(21) Appl. No.: 18/090,031

(22) Filed: Dec. 28, 2022

(65) Prior Publication Data
US 2024/0178001 A1    May 30, 2024

(30) Foreign Application Priority Data
Nov. 29, 2022   (CN) ......................... 202211511556.8

(51) Int. Cl.
*H01L 21/311*    (2006.01)
*H01L 21/768*    (2006.01)
*H10B 41/20*    (2023.01)
*H10B 43/20*    (2023.01)

(52) U.S. Cl.
CPC .. *H01L 21/31144* (2013.01); *H01L 21/76877* (2013.01); *H10B 41/20* (2023.02); *H10B 43/20* (2023.02)

(58) Field of Classification Search
CPC ......... H01L 21/31144; H01L 21/76877; H10B 41/20; H10B 43/20; H10B 41/27; H10B 41/50; H10B 43/10; H10B 43/27; H10B 43/50

See application file for complete search history.

(56) References Cited

U.S. PATENT DOCUMENTS

| | | | |
|---|---|---|---|
| 2021/0193574 A1* | 6/2021 | Sun ...................... | H01L 21/311 |
| 2021/0233928 A1* | 7/2021 | Lee ........................ | H10B 43/27 |
| 2022/0005825 A1* | 1/2022 | Zhang .................. | H01L 25/0657 |
| 2023/0246085 A1* | 8/2023 | Kubo ..................... | H10B 43/10 |
| | | | 257/324 |

* cited by examiner

*Primary Examiner* — Karen Kusumakar
(74) *Attorney, Agent, or Firm* — Oblon, McClelland, Maier & Neustadt, L.L.P.

(57) ABSTRACT

A semiconductor device includes a stack of alternating word line layers and insulating layers. The stack includes a core area, a stair step area, and, optionally, a dummy transition area connecting the core area to the stair step area. The semiconductor device also includes a gate line (GL) trench through the stack extending from the core area through the dummy transition area to the stair step area. The GL trench has a first width within the core area and a second width within the stair step area that is different from the first width. The semiconductor device also includes a first channel structure formed through the stack within the core area, and a stair step contact (SCT) formed through at least a portion of the stack within the stair step area. The SCT connects one of the word line layers of the stack within the stair step area.

20 Claims, 12 Drawing Sheets

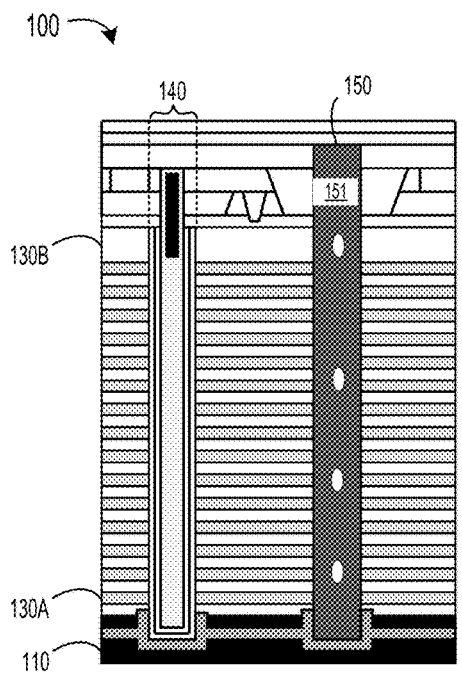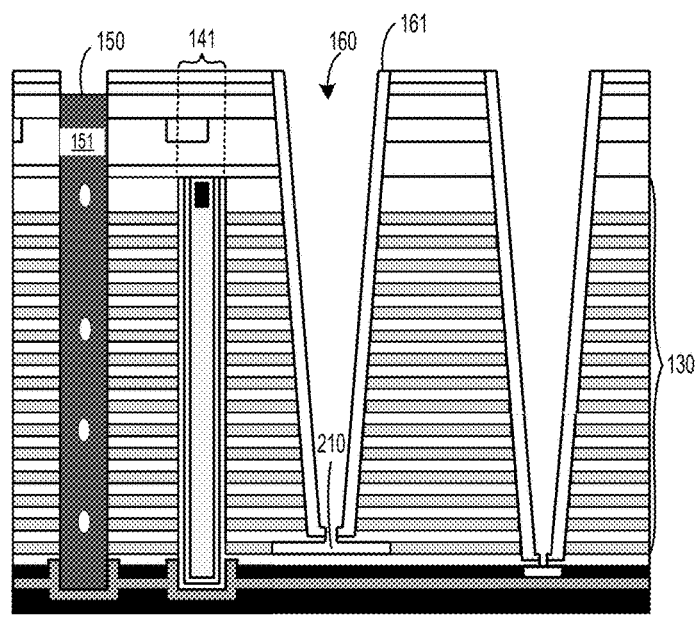
FIG. 2A     FIG. 2B
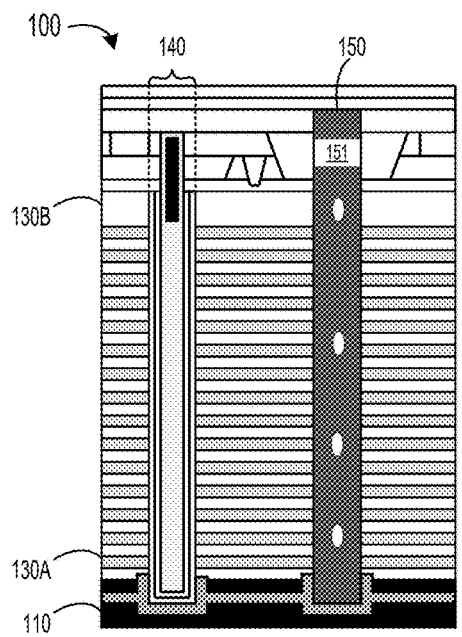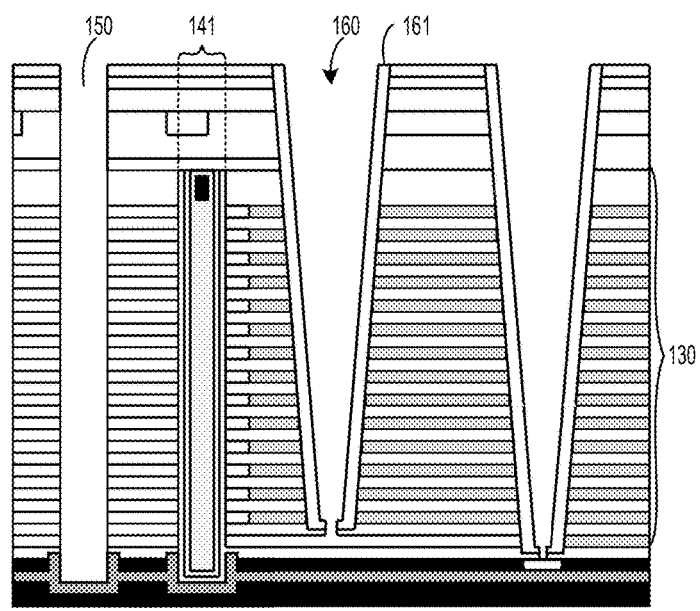
FIG. 3A     FIG. 3B

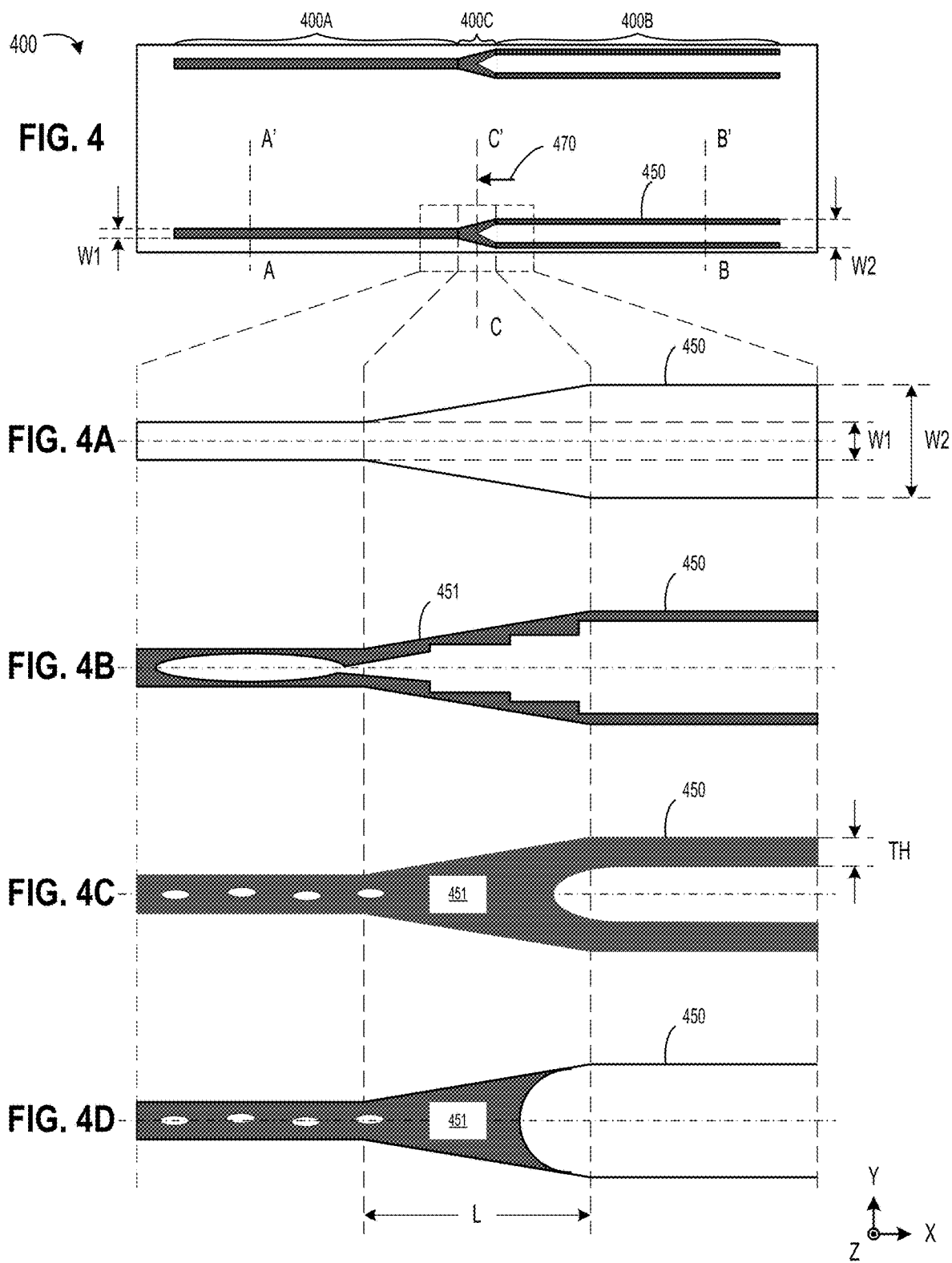

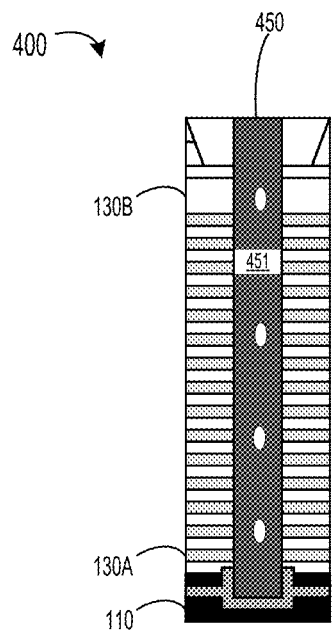 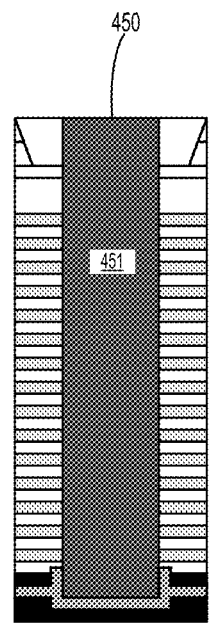 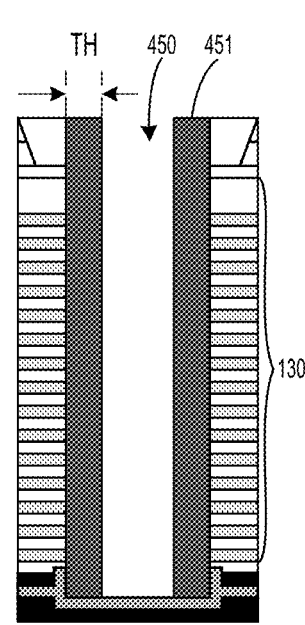
FIG. 5A  FIG. 5C  FIG. 5B
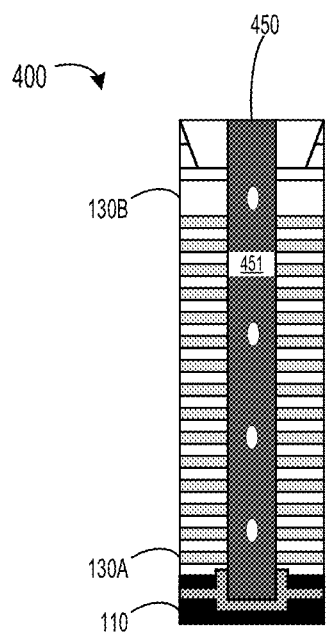 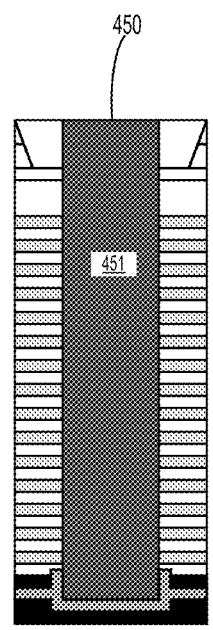 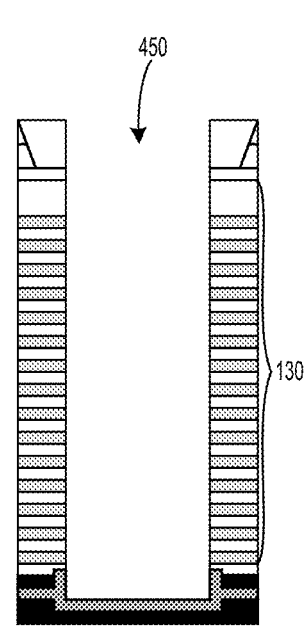
FIG. 6A  FIG. 6C  FIG. 6B

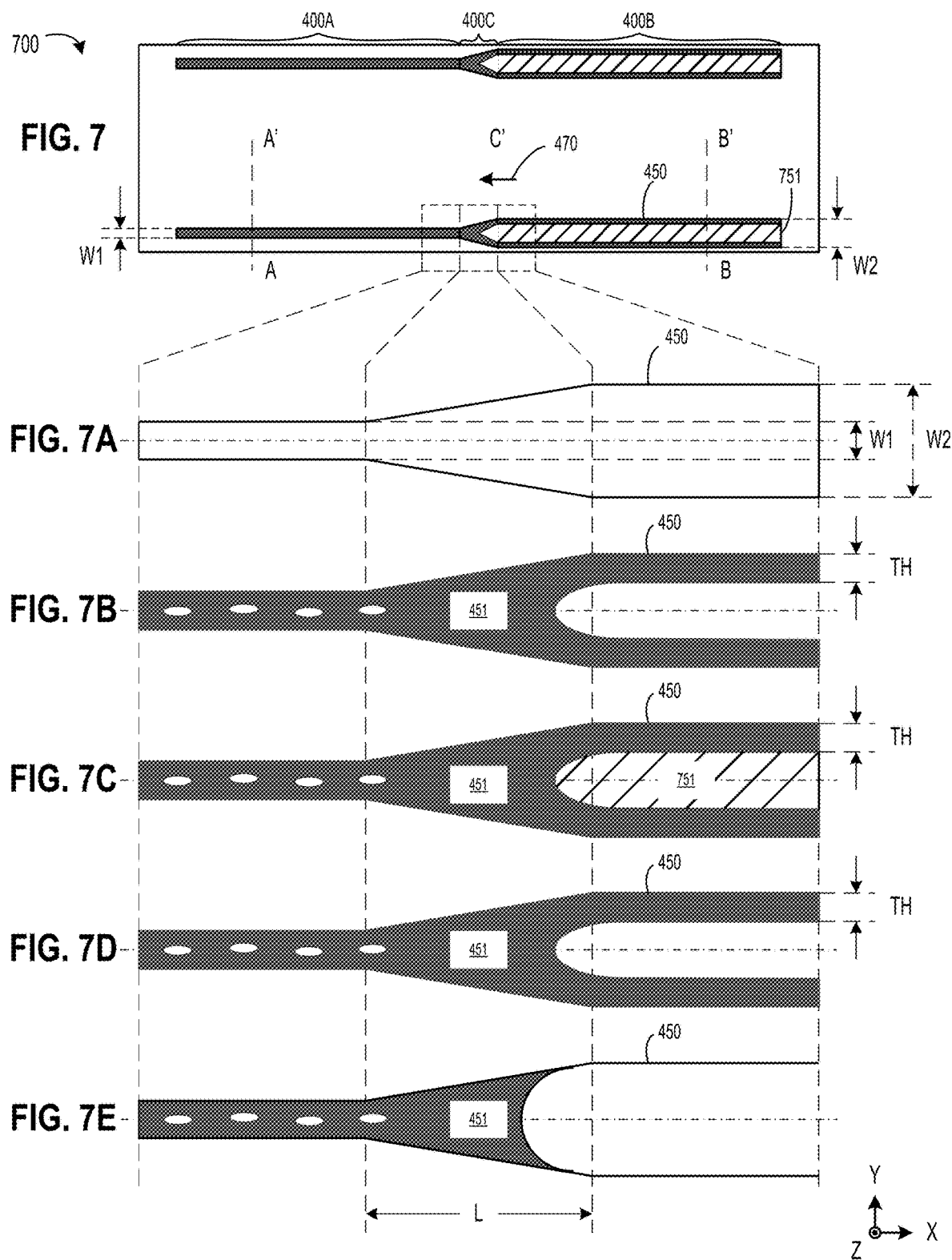

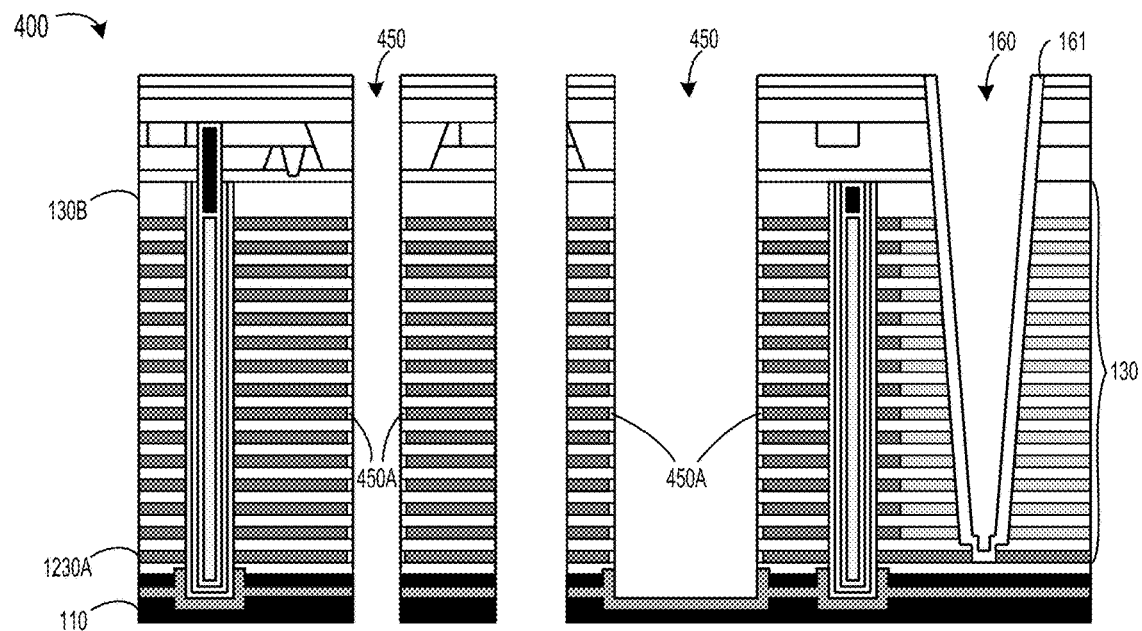
FIG. 12A　　　　FIG. 12B
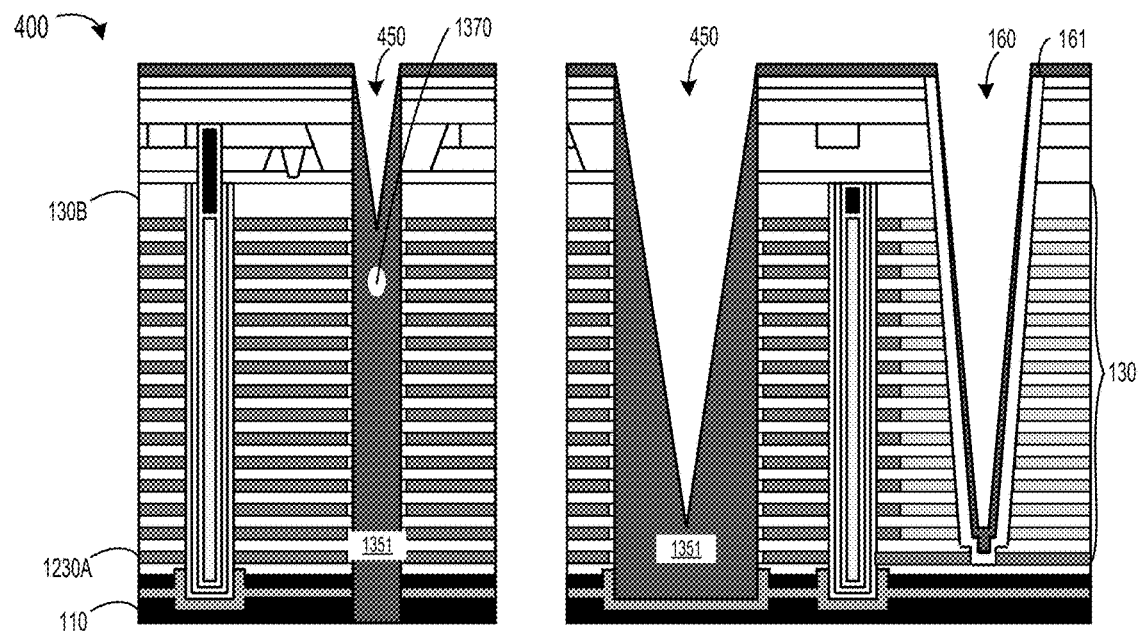
FIG. 13A　　　　FIG. 13B
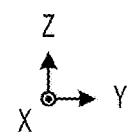

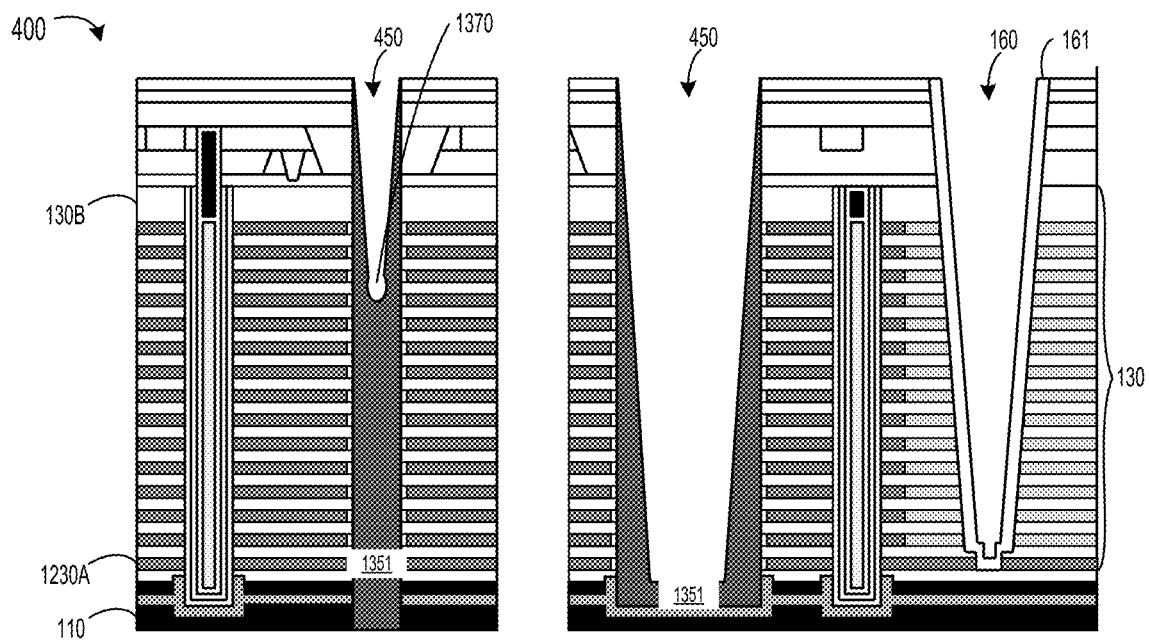
FIG. 14A    FIG. 14B
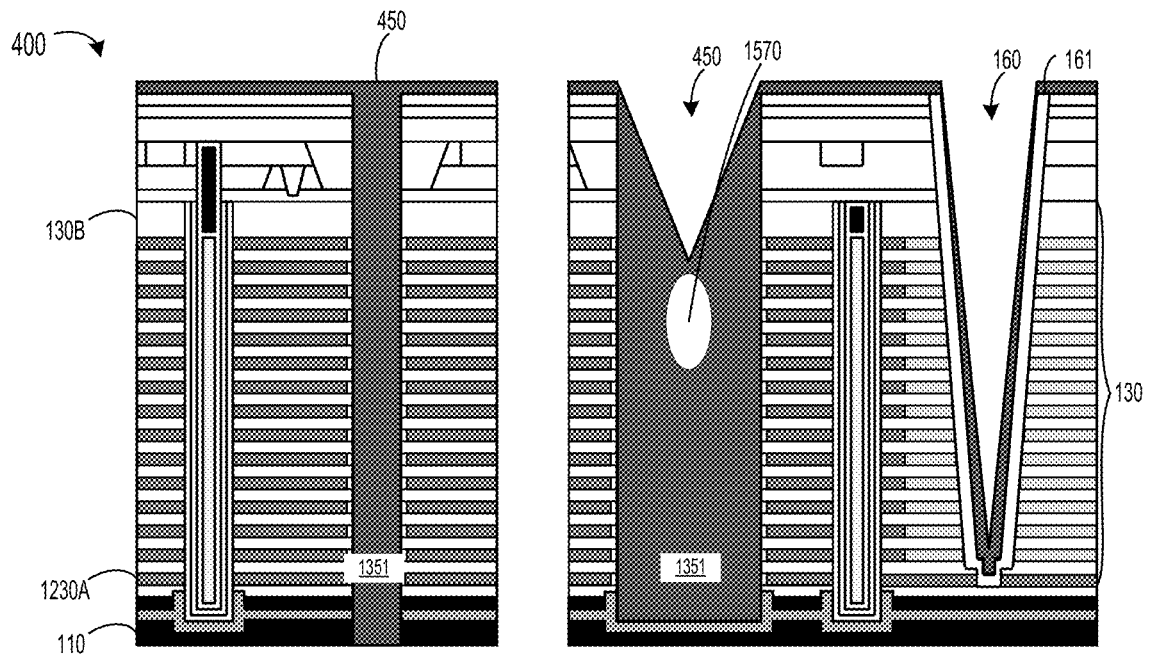
FIG. 15A    FIG. 15B
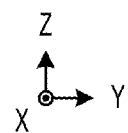

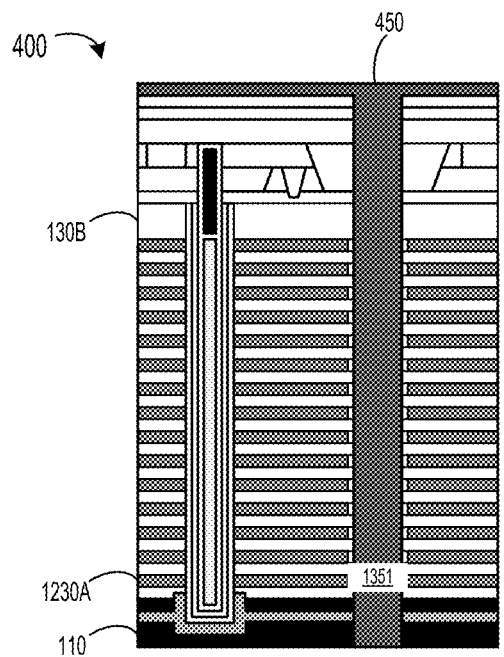
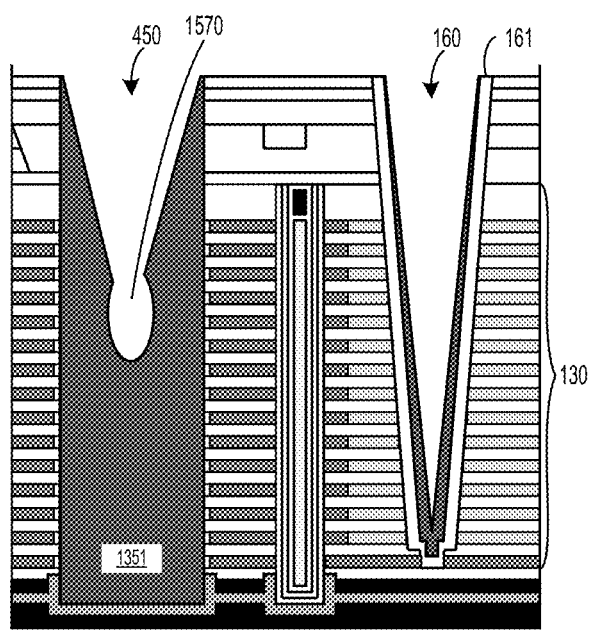
FIG. 16A        FIG. 16B
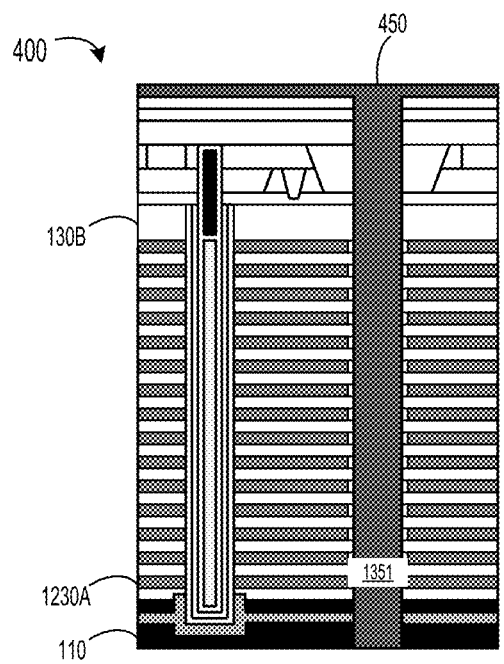
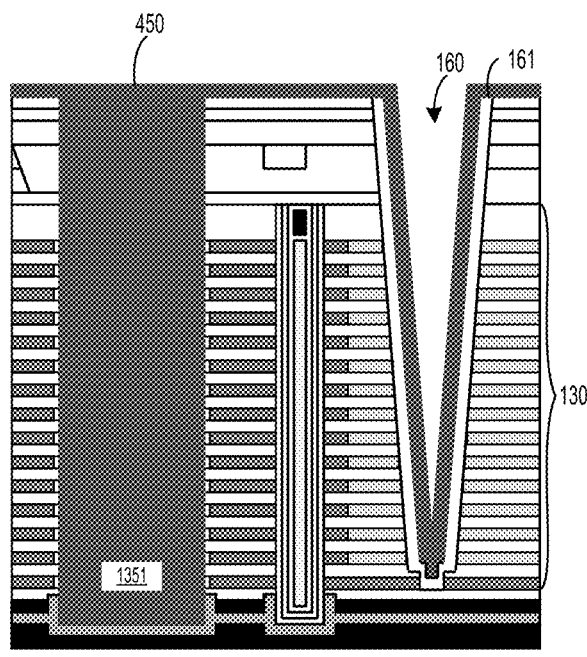
FIG. 17A        FIG. 17B
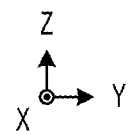

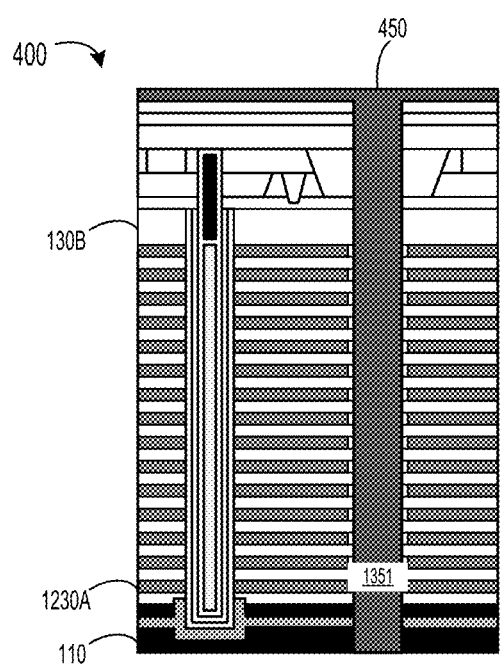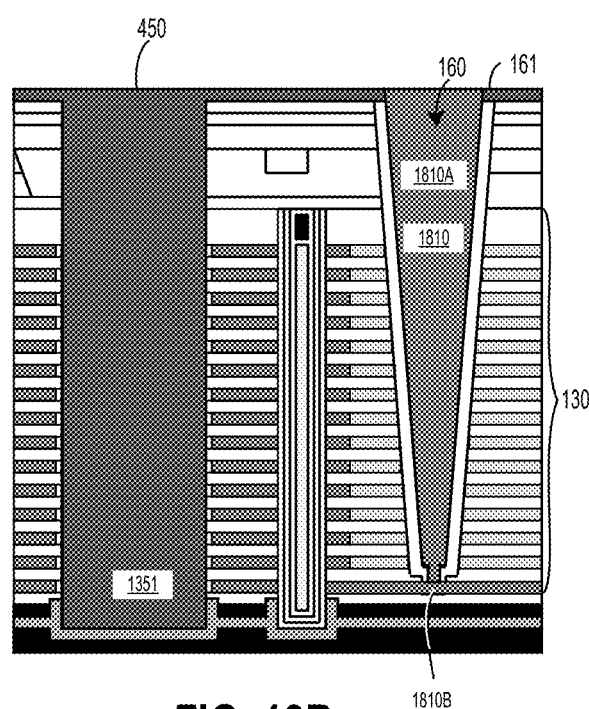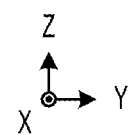
FIG. 18A  FIG. 18B

GATELINE MASK DESIGN FOR REMOVING SACRIFICIAL GATELINE POLYSILICON WITHIN STAIR STEP AREA

CROSS-REFERENCE

This application claims the priority to Chinese Application No. 202211511556.8, filed on Nov. 29, 2022. The entire disclosure of the prior application is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A 3D NAND memory device is an exemplary device of stacking multiple planes of memory cells to achieve greater storage capacity, and to achieve lower costs per bit. The 3D NAND memory device can include a stack of alternating insulating layers and word line layers over a substrate and a slit structure.

SUMMARY

The present disclosure describes embodiments related to a 3D semiconductor device, a method of fabricating the same, and a memory system including the same.

According to an aspect of the disclosure, a semiconductor device is provided. For example, the semiconductor device can include a stack of alternating word line layers and insulating layers, the stack including a core area and a stair step area connected to the core area. The semiconductor device can also include one or more gate line (GL) structure through the word line layers and the insulating layers of the stack, the GL structures extending from the core area to the stair step area, at least one of the GL structures having a first width within the core area and a second width within the stair step area that is different from the first width. The semiconductor device can also include one or more first channel structures formed through the stack within the core area. The semiconductor device can also include one or more stair step contacts (SCTs) each formed through at least a portion of the stack within the stair step area, the SCTs each connecting one of the word line layers of the stack within the stair step area.

In an embodiment, the second width can be greater than the first width. For example, the second width can be $1^+$-3 times greater than the first width.

In an embodiment, the semiconductor device can further include a dummy transition area connected between the stair step area and the core area, wherein the GL structure within the dummy transition area has a width monotonously decreased from a first end connected to the stair step area to a second end connected to the core area. In an embodiment, the semiconductor device can further include another stack of alternating dielectric layers and insulating layers within the stair step area, the another stack of alternating dielectric layers and insulating layers being in contact with the stack of alternating word line layers and insulating layers within the stair step area. For example, each layer of the another stack of alternating dielectric layers and insulating layers can be in line with a corresponding layer of the stack of alternating word layers and insulating layers.

In an embodiment, the SCTs each can include a vertical portion through the portion of the stack within the stair step area and a horizontal portion connected to a bottom end of the vertical portion at a center thereof and to one of the word line layers within the stair step area that the portion of the stack reaches.

According to an aspect of the disclosure, a method for fabricating a semiconductor device is provided. For example, the method can include providing a stack of alternating sacrificial layers and insulating layers over a substrate, the stack including a core area and a stair step area connected to the core area. The method can also include forming one or more gate line (GL) trenches through the sacrificial layers and the insulating layers of the stack extending from the core area to the stair step area. The method can also include filling the GL trenches with a first trench filler material such that the first trench filler material in at least one of the GL trenches within one of the core area and the stair step area is hollow.

In an embodiment, the GL trench within the other of the core area and the stair step area can be fully filled by the first trench filler material. In another embodiment, the GL trench can have a first width within the one of the core area and the stair step area and a second width within the other of the core area and the stair step area that is different from the first width. For example, the second width can be less than the first width. In an embodiment, the method can further include removing the first trench filler material in the GL trench within the one of the core area and the stair step area, and removing and replacing the sacrificial layers of the stack within the one of the core area and the stair step area with a first conductive layer. For example, the one of the core area and the stair step area can be the stair step area, and the method can further include forming within the stair step area a stair step contact (SCT) through at least a portion of the stack that connects the first conductive layer.

In an embodiment, the method can further include removing the first trench filler material in the GL trench within the core area, and removing and replacing a portion of the sacrificial layers of the stack within the core area with a second conductive layer. For example, the method can further include filling the GL trench within the core area and the stair step area with a second trench filler material. As another example, filling the GL trench within the core area and the stair step area with the second trench filler material can include filling the second trench filler material in the GL trench until a first predetermined number of holes is formed in the second trench filler material in the GL trench within the core area, etching back the second trench filler material in the GL trench until the first predetermined number of holes is opened, filling the second trench filler material in the GL trench until a second predetermined number of holes is formed in the second trench filler material in the GL trench within the stair step area, etching back the second trench filler material in the GL trench within the stair step area until the second predetermined number of holes is opened, and filling the second trench filler material in the GL trench within the stair step area.

In an embodiment, the SCT can be formed by forming within the stair step area an SCT opening through the portion of the stack to uncover lateral sides of the insulating layers and the sacrificial layers of the portion of the stack and one of the sacrificial layers that the portion of the stack reaches, forming a spacer that covers the lateral sides of the insulating layers, removing a portion of the sacrificial layer to form a space, forming a liner to cover the spacer and fill the space, removing the sacrificial layers of the stack within the stair step area, removing the sacrificial layers of the stack within the core area, replacing the sacrificial layers of the stack within the core area and the stair step area with the first conductive layer, removing a portion of the liner filled in the space, and filling a metal material in the space and the SCT opening to connect the first conductive layer.

In an embodiment, the method can further include filling the hollow first trench filler material with a second trench filler material. For example, the second trench filler material does not interface with the first trench filler material.

According to an aspect of the disclosure, a memory system including a semiconductor device is provided. For example, the memory system can include a semiconductor device and control circuitry coupled to the semiconductor device, the control circuitry configured for controlling operations of the semiconductor device. In an embodiment, the semiconductor device can include a stack of alternating word line layers and insulating layers, the stack including a core area and a stair step area connected to the core area. The semiconductor device can also include one or more gate line (GL) structure through the word line layers and the insulating layers of the stack extending from the core area to the stair step area, at least one of the GL structures having a first width within the core area and a second width within the stair step area that is different from the first width. The semiconductor device can also include one or more first channel structures formed through the stack within the core area. The semiconductor device can also include one or more stair step contacts (SCTs) each formed through at least a portion of the stack within the stair step area, the SCTs each connecting one of the word line layers of the stack within the stair step area.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

FIGS. 1A-3A are cross-sectional views of various intermediate steps of a method of manufacturing the 3D semiconductor structure along a cut line AA' shown in FIG. 1.

FIGS. 1B-3B are cross-sectional views of various intermediate steps of the method of manufacturing the 3D semiconductor structure along a cut line BB' shown in FIG. 1.

FIG. 4 is a top view of an exemplary 3D semiconductor structure in accordance with some embodiments of the present disclosure.

FIGS. 4A-4D are enlarged top views of various intermediate steps of a method for filling gate line (GL) trenches of the 3D semiconductor structure with a trench filler material in accordance with some embodiments of the present disclosure.

FIGS. 5A-5C are cross-sectional views of various intermediate steps of the method along cut lines AA', BB' and CC' shown in FIG. 4, respectively, corresponding to the intermediate step of the method shown in FIG. 4C.

FIGS. 6A-6C are cross-sectional views of various intermediate steps of the method along cut lines AA', BB' and CC' shown in FIG. 4, respectively, corresponding to the intermediate step of the method shown in FIG. 4D.

FIG. 7 is a top view of an exemplary 3D semiconductor structure in accordance with some embodiments of the present disclosure.

FIGS. 7A-7E are enlarged top views of various intermediate steps of a method for filling GL trenches of the 3D semiconductor structure with first and second trench filler materials sequentially in accordance with some embodiments of the present disclosure.

FIGS. 12A-18A are cross-sectional views of various intermediate steps of a method (referred to as a Deposition-Etch-Deposition-Etch-Deposition (D-E-D-E-D) method) for filling the GL trenches of the semiconductor structure with a trench filler material along the cut line AA' shown in FIG. 4 in accordance with some embodiments of the present disclosure.

FIGS. 12B-18B are cross-sectional views of various intermediate steps of a method for filling the GL trenches with the trench filler material along the cut line BB' shown in FIG. 4 in accordance with some embodiments of the present disclosure.

DETAILED DESCRIPTION

Figure 1:
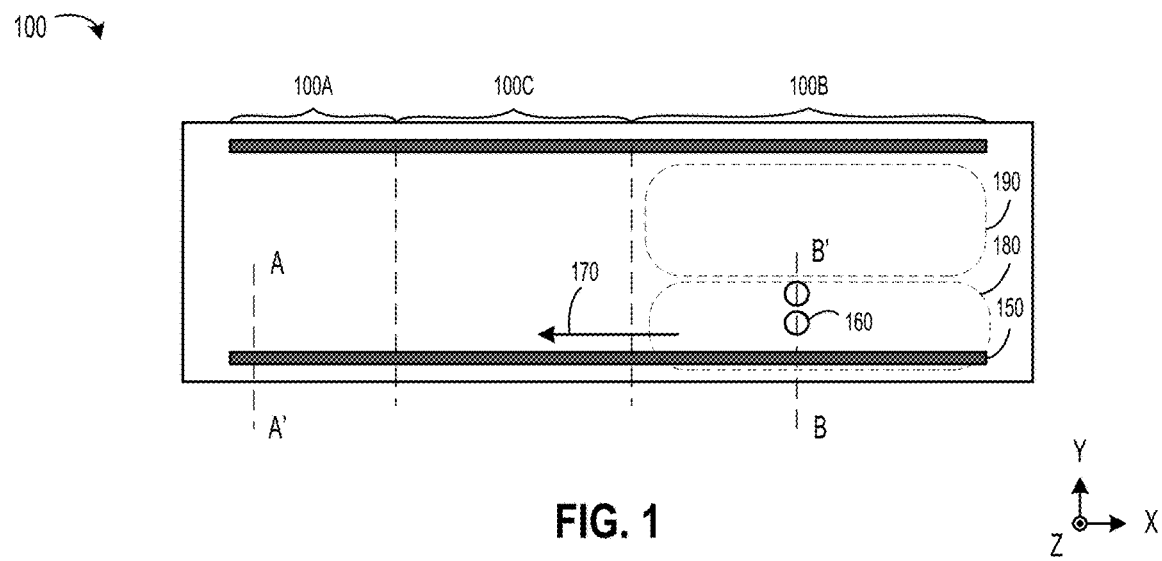
FIG. 1 is a top view of a 3D semiconductor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+−. 10%, .+−. 20%, or .+−. 30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 is a top view of a 3D semiconductor structure 100. The 3D semiconductor structure 100 can be used to manufacturing a 3D NAND memory device. The semiconductor structure 100 includes a core area 100A, a stair step area 100B, and a dummy transition area 100C connecting the core area 100A and the stair step area 100B. In the 3D NAND memory device, a stack of transistors that includes memory cells that form a vertical memory cell string can be formed within the core area 100A, and stair step contacts (SCTs) can be formed within the stair step area 100B that each connect one of word line layers of the stack of transistors within the core area 100A through the dummy transition area 100C. In some embodiments, the dummy transition area 100C can be omitted, and the SCTs can connect the word line layers of the stack of transistors within the core area 100A directly.

FIGS. 1A-3A are cross-sectional views of various intermediate steps of a method of manufacturing the 3D semiconductor structure 100 along a cut line AA' shown in FIG. 1. FIGS. 1B-3B are cross-sectional views of various intermediate steps of the method of manufacturing the 3D semiconductor structure 100 along a cut line BB' shown in FIG. 1.

The semiconductor structure 100 includes a substrate 110 and a stack 130 of alternating sacrificial layers 130A and insulating layers 130B provided over the substrate 110. The substrate 110 can be any suitable semiconductor substrate having any suitable semiconductor materials, such as monocrystalline, polycrystalline or single crystalline semiconductors. For example, the substrate 110 can include silicon, silicon germanium (SiGe), germanium (Ge), gallium arsenide (GaAs), silicon on insulator (SOI), germanium on insulator (GOI), gallium nitride, silicon carbide, III-V compound, or any combinations thereof.

The stack 130 can extend in a lateral direction parallel to a top surface of the substrate 110. The sacrificial layers 130A and the insulating layers 130B can alternate in a vertical direction perpendicular to the lateral direction. The sacrificial layers 130A can be the same or different from each other in thickness, for example, ranging from 10-500 nm, preferably about 35 nm. The insulating layers 130B can also be the same or different from each other in thickness, for example, ranging from 10-500 nm, preferably about 25 nm. It should be noted that the number of the sacrificial layers 130A and the insulating layers 130B shown in FIGS. 1A-3A and 1B-3B is for illustration only and that any suitable number of the sacrificial layers 130A and the insulating layers 130B can be included in the stack 130 of the semiconductor structure 100. The sacrificial layers 130A can include silicon oxide, silicon nitride, polysilicon, or other suitable materials. The insulating layers 130B can include dielectric materials, such as silicon oxide, silicon nitride, silicon oxynitride, or any combination thereof. In some embodiments, the insulating layers 130B can also include high-k dielectric materials, such as hafnium oxide, zirconium oxide, aluminum oxide, tantalum oxide, lanthanum oxide, or any combination thereof.

One or more channel structures can be formed in the stack 130 through the sacrificial layers 130A and the insulating layers 130B of the stack 130 into the substrate 110. For example, a first channel structure 140 is formed within the core area 100A, as shown in FIGS. 1A-3A, and a second channel structure 141 is formed within the stair step area 100B, as shown in FIGS. 1B-3B. In an embodiment, each of the first and second channel structures 140 and 141 can be in the shape of a cylinder or a pillar, and include a high-k layer, a block layer surrounded by the high-k layer, a charge trapping layer (or a storage layer) surrounded by the block layer, a tunneling layer surrounded by the charge trapping layer, a channel layer surrounded by the tunneling layer, and a core filler layer surrounded by the channel layer (not shown), which extend through the sacrificial layers 130A and the insulating layer 130B of the stack 130, and a channel contact (not shown) formed above the core filler layer and being in contact with the channel layer. In some embodiments, the channel layer can include silicon, such as amorphous silicon, polysilicon, or single crystalline silicon, the tunneling layer can include silicon oxide, silicon nitride, or any combination thereof, the blocking layer can include silicon oxide, silicon nitride, high-k dielectrics, or any combination thereof, and the charge trapping layer can include silicon nitride, silicon oxynitride, silicon, or any combination thereof. In an embodiment, the tunneling layer, the charge trapping layer and the blocking layer, collectively referred to as a memory film, can include ONO dielectrics (silicon Oxide-silicon Nitride-silicon Oxide). Each of the first and second channel structures 140 and 141 can be formed as follows: one or more channel openings (not shown) are formed subsequently by a combination of a photolithography process and an etching process to extend through the sacrificial layers 130A and the insulating layer 130B of the stack 130 down into the substrate 110; and the high-k layer, the block layer, the charge trapping layer, the tunneling layer, the channel layer, the core filler layer and the channel contact can be formed within the channel openings subsequently. In an embodiment, the sacrificial layers 130A of the stack 130 within the core area 100A can be replaced with a conductive material, e.g., tungsten (W), to form word line layers of the 3D semiconductor structure 100, e.g., a 3D NAND memory device, which may include a stack of transistors that includes memory cells that form a vertical memory cell string along the first channel structure 140, and the first channel structure 140 can be connected to one or more metal layers (not shown) formed above the stack 130. In another embodiment, the second channel structure 141 is a dummy channel structure and is used to support the sacrificial layers 130A and the insulating layers 130B of the stack 130 within the stair step area 100B, and thus no metal layer is connected to the second channel structure 141.

One or more gate line (GL) trenches 150 can be formed within the stack 130 extending from the core area 100A through the dummy transition area 100C to the stair step area 100B in a first horizontal direction, e.g., X direction, to divide the semiconductor structure 100 into a plurality of semiconductor blocks. In an embodiment, a tetraethyl orthosilicate (TEOS) hard mask (not shown) can be deposited over the stack 130 in a deposition process, e.g., a chemical vapor deposition (CVD) process, a photoresist layer (not shown) can be applied over the TEOS hard mask and is patterned corresponding to the trench locations within the stack 130, and the stack 130 with the TEOS hard mask formed thereover can then be etched, whereby the GL trenches 150 can be formed within the stack 130 to uncover the substrate 110 and lateral sides of the sacrificial layers 130A and the insulating layers 130B of the stack 130 are exposed. The GL trenches 150 can then be filled with a trench filler material 151, e.g., polysilicon.

Figures 1A, 1B:
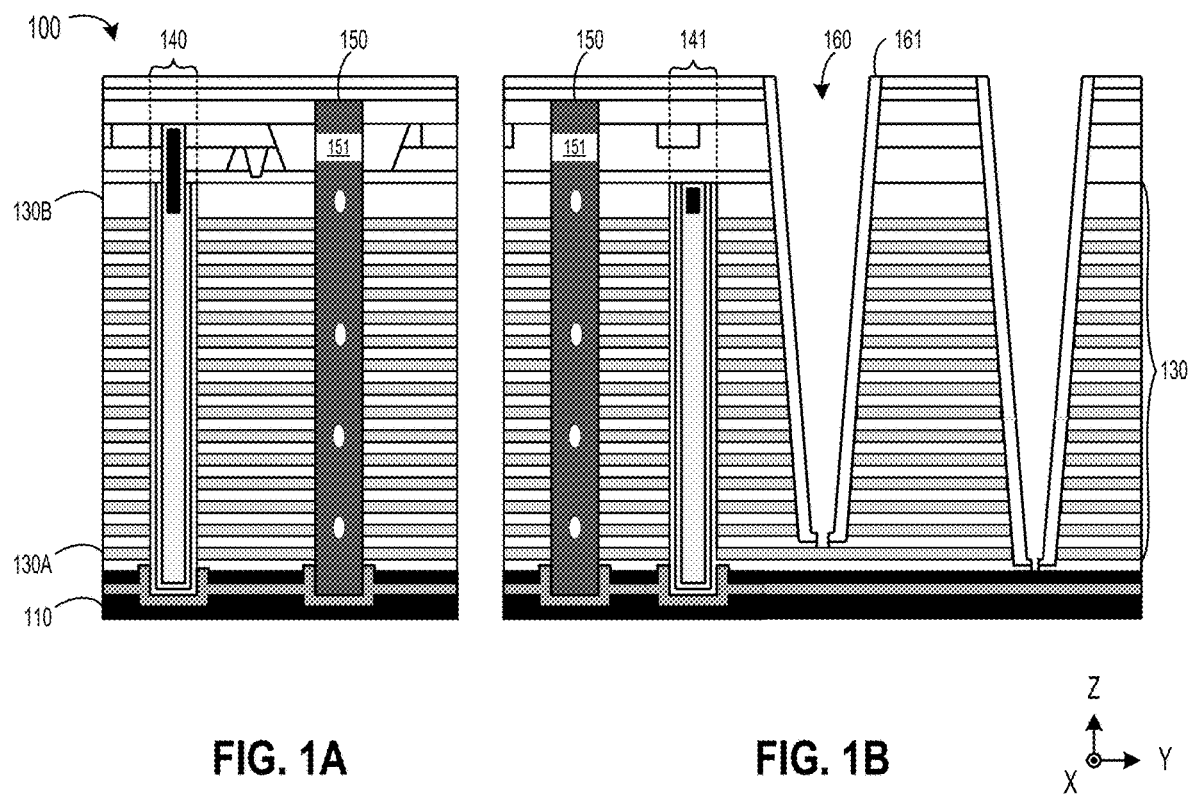

One or more stair step contacts (SCTs) can be formed within the stair step area 100B to connect the word line layers of the 3D NAND memory device that replace the sacrificial layers 130A of the stack 130 of the 3D semiconductor structure 100. In an embodiment, an SCT opening 160 can be formed to extend from a topmost one of the insulating layers 130B (indicated by "130B" shown in FIG. 1B, for example) into a portion of the sacrificial layers 130A and the insulating layers 130B of the stack 130 to reach a desired one of the sacrificial layers 130A (indicated by "130A" shown in FIG. 1B, for example) to expose lateral sides of the portion of the sacrificial layers 130A and the insulating layers 130B of the stack 130; a spacer 161 can then be formed to cover the lateral sides of the portion of the sacrificial layers 130A and the insulating layers 130B of the stack 130 and a top surface of the desired sacrificial layer 130A; and the spacer 161 covering the top surface of the desired sacrificial layer 130A can be removed, e.g., by etching, as shown in FIG. 1B.

As shown in FIG. 2B, a portion of the desired sacrificial layer 130A that is exposed by the SCT opening 160 is etched and recessed to form a horizontal space 210.

As shown in FIG. 3B, the core area 100A can be covered by a mask (not shown), with the stair step area 100B uncovered, and an enchant, e.g., sulfuric acid ($H_2SO_4$) and tetramethyl ammonium hydroxide (TMAH), can be applied to remove the trench filler material 151 in the GL trench 150 within the stair step area 100B in order to remove a portion of the sacrificial layers 130A of the stack 130 within the stair step area 100B. The stair step area 100B can be covered with another mask (not shown), with the core area 100A uncovered, and the sacrificial layers 130A of the stack 130 within the core area 100A can be removed by applying $H_2SO_4$ or TMAH, for example, to the trench filler material 151 in the GL trench 150 within the core area 100A. Then, the spaces formed after the sacrificial layers 130A of the stack 130 within the core area 100A and the stair step area 100B can be filled with a conductive material, e.g., tungsten (W), to form word line layers of the semiconductor structure 100. The stack 130 within the stair step area 100B can thus include an O—W—O—W (oxide-tungsten-oxide-tungsten) stack 180, in which the sacrificial layers 130A are removed and replaced with the conductive material, i.e., W, and an O—N—O—N(oxide-nitride (dielectric)-oxide-nitride (dielectric)) stack 190, n which the sacrificial layers 130A are intact.

As the need for more word line layers of a 3D NAND memory device increases, the height of the stack 130 has to be increased accordingly, which leads to the GL trenches 150 with a high aspect ratio (trench depth vs trench width, e.g., 15 μm vs 400 nm). As shown in FIG. 3B, the etchant cannot reach the desired sacrificial layer 130A of the stack 130 in the SCT opening 160 within the stair step area 100B until the entire trench filler material 151 in the GL trench 150 within the stair step area 100B has been removed completely. Accordingly, a sufficient amount of the etchant will be needed in order to remove the entire trench filler material 151 in the GL trench 150 within the stair step area 100B. However, such the sufficient amount of the etchant will also remove a great amount of the sacrificial layers 130A within the dummy transition area 100C in X direction, as indicated by an arrow 170 shown in FIG. 1, and the dummy transition area 100C has to be as long as, for example, 50 μm or even 80 μm in length, depending on the number of the sacrificial layers 130A and the insulating layers 130B of the stack 130, in order to prevent the enchant from flowing through the dummy transition area 100C to the core area 100A to remove the sacrificial layers 130A of the stack 130 within the core area 130A. Besides, the GL trench 150 within the stair step area 100B is fully filled with the trench filler material 151, and the enchant is in point contact with the trench filler material 151. Accordingly, it takes a long time, e.g., 800 minutes, for the enchant to remove the entire trench filler material 151 filled in the GL trench 150 within the stair step area 100B.

FIG. 4 is a top view of an exemplary 3D semiconductor structure 400 in accordance with some embodiments of the present disclosure. The 3D semiconductor structure 400 can be used to manufacturing a 3D NAND memory device. The semiconductor structure 400 is similar to the semiconductor structure 100, and can also include a core area 400A, a stair step area 400B, and a dummy transition area 400C connecting the core area 400A and the stair step area 400B. In some embodiments, the dummy transition area 400C can be omitted, and the core area 400A can be connected to the stair step area 400B directly. The semiconductor structure 400 also includes the substrate 110 and the stack 130, which is provided over the substrate 110. The stack 130 can extend in a lateral direction parallel to a top surface of the substrate 110. The sacrificial layers 130A and the insulating layers 130B of the stack 130 can alternate in a vertical direction perpendicular to the lateral direction. The semiconductor structure 400 differs from the semiconductor structure 100 in that the semiconductor structure 400 includes one or more GL trenches 450, each of which has different widths within the core area 400A and the stair step area 400B, instead of the GL trenches 150, each of which has the same width within the core area 100A and the stair step area 100B. In an embodiment, at least one of the GL trenches 450 has a first width W1 within the core area 400A and a second width W2 within the stair step area 400B that is greater than the first width W1. For example, the second width W2 can be 1+(i.e., greater than 1)–3 times, e.g., 1.5, 2.0, 2.5 and 3.0, preferably 2.5 times, greater than the first width W1. In some examples, the first width W1 is 400 nm, and the second width W2 is 1,200 nm. In an embodiment, the first width W1 and the second width W2 are in a second horizontal direction, e.g., Y direction, which is perpendicular to the first horizontal direction. Accordingly, the GL trench 450 within the dummy transition area 400C has a width decreasing from one end connected to the stair step area 400B to the other end connected to the core area 400A. In an embodiment, the width of the GL trench 450 within the dummy transition area 400C is decreased monotonously. For example, the width of the GL trench 450 within the dummy transition area 400C can be decreased monotonously strictly. As another example, the width of the GL trench 450 within the dummy transition area 400C is monotonously decreased continuously, that is, without any abrupt width decrease.

FIGS. 4A-4D are enlarged top views of various intermediate steps of a method for filling the GL trenches 450 with a trench filler material in accordance with some embodiments of the present disclosure. FIGS. 5A-5C are cross-sectional views of various intermediate steps of the method along cut lines AA', BB' and CC' shown in FIG. 4, respectively, corresponding to the intermediate step of the method shown in FIG. 4C. FIGS. 6A-6C are cross-sectional views of various intermediate steps of the method along cut lines AA', BB' and CC' shown in FIG. 4, respectively, corresponding to the intermediate step of the method shown in FIG. 4D.

As shown in FIG. 4A, the GL trenches 450 can be formed by a combination of a photolithography process and an etching process to extend through the sacrificial layers 130A and the insulating layers 130B of the stack 130 into the substrate 110 to expose lateral sides of the sacrificial layers 130A and the insulating layers 130B of the stack 130 in the GL trenches 450.

As shown in FIG. 4B, a trench filler material 451 can be deposited to cover the exposed sacrificial layers 130A and the insulating layers 130B of the stack 130 in the GL trenches 450. For example, the trench filler material 451 can include polysilicon, tungsten, or other suitable materials. In an embodiment, the trench filler material 451 can be deposited and formed in a deposition process, such as an ALD process, a CVD process, a plasma-enhanced CVD (PECVD) process, or the like. In the example embodiment, the trench filler material 451 is formed in the ALD process. The ALD process is often performed at a low temperature, which makes less or even no damages on the components already fabricated, and can provide ultra-thin nano-layers in a precise manner on the exposed lateral sides of the sacrificial layers 130A and the insulating layers 130B of the stack 130 in the GL trenches 450.

As shown in FIGS. 4C and 5A-5C, the ALD process is kept on being performed until the GL trenches 450 within the core area 400A are fully filled by the trench filler material 451, and the trench filler material 451 formed in the GL trenches 450 within the stair step area 400B thus has a predetermined thickness TH, e.g., 200 nm, so that the trench filler material 451 in the GL trenches 450 within the stair step area 400B is hollow. Accordingly, the GL trenches 450 within the dummy transition area 400C are almost filled by the trench filler material 451. As the width of the GL trenches 450 within the dummy transition area 400C is decreased monotonously and has no abrupt width decrease, the trench filler material 451 filled in the GL trenches 450 within the dummy transition area 400C are conformal and seamless.

As shown in FIGS. 4D and 6A-6C, the trench filler material 451 in the GL trenches 450 within the stair step area 400B is removed, in order for the sacrificial layers 130A of the stack 130 within the stair step area 400B to be remove, as described above with respect to FIGS. 1B, 2B and 3B. As the trench filler material 451 in the GL trenches 450 within the stair step area 400B is hollow, the etchant that is applied to remove the desired sacrificial layer 130A of the stack 130 within the stair step area 400B will be in plane contact with the trench filler material 451, which has the thickness TH, e.g., 200 nm, far less than the depth, e.g., 15 μm. Therefore, a small (or insufficient) amount of the etchant and/or short etching time are enough to remove the thin hollow trench filler material 451 completely. As the GL trenches 450 within the dummy transition area 400C are filled by the trench filler material 451 seamlessly, the insufficient amount of the enchant, though flowing toward the core area 400A, as indicated by an arrow 470 shown in FIG. 4, will not flow through the dummy transition area 400C to the core area 400A to remove the sacrificial layers 130A of the stack 130 within the core area 400A, as long as the dummy transition area 400C has a length L corresponding to, e.g., greater than, the thickness TH of the hollow trench filler material 451. For example, the length L of the dummy transition area 400C can be 500 nm, which is far less than 50 μm required by the dummy transition area 100C of the 3D semiconductor structure 100, the GL trenches 150 of which have a constant width. Accordingly, the core area 400A of the semiconductor structure 400 has a greater space and allows more transistors to be fabricated therewithin, as compared with the core area 100A of the semiconductor structure 100, the space of which is significantly compromised by the long dummy transition area 100C. Besides, as the enchant is in plane contact with the thin hollow trench filler material 451 in the GL trenches 450 within the stair step area 400B, it takes a far shorter time, e.g., tens of minutes, compared with 800 minutes, for the enchant to remove the entire hollow trench filler material 451 filled in the GL trenches 550 within the stair step area 400B.

Then, the sacrificial layers 130A of the stack 130 within the stair step area 400B can be removed, and the sacrificial layers 130A of the stack 130 within the core area 400A can also be removed subsequently. As the thin hollow trench filler material 451 in the GL trenches 450 within the stair step area 400B can be removed completely with the insufficient amount of the enchant, and such the insufficient amount of the enchant, even applied to the trench filler material 451 in the GL trenches 450 within the core area 400A, will be in point contact with the deep trench filler material 451 in the GL trenches 450 within the core area 400A and remove only a tiny portion of the trench filler material 451 from the top thereof, without removing any portion of the sacrificial layers 130A of the stack 130 within the core area 400A, the two masks which are needed for the removal of the sacrificial layers 130A of the stack 130 within the stair step area 100B and the sacrificial layers 130A of the stack 130 within the core area 100A of the semiconductor structure 100 can be omitted. Compared with the solid, deep trench filler material 151 of the semiconductor structure 100, the removal of which requires a combination of various processes, e.g., alignment and etching processes, the hollow, thin trench filler material 451 of the semiconductor structure 400 can be removed by a single process, e.g., a pure wet etching process.

In the example embodiment shown in FIGS. 4, 4A-4D, 5A-5C and 6A-6C, the GL trench 450 has the greater second width W2 within the stair step area 400B and the less first width W1 within the core area 400A, and the sacrificial layers 130A of the stack 130 within the stair step area 400B are removed followed by the removal of the sacrificial layers 130A of the stack 130 within the core area 400A. In some embodiments, the GL trench 450 can have the first width W1 within the core area 400A that is greater than the second width W2 within the stair step area 400B, and, accordingly, the trench filler material 151 in the GL trench 150 within the core area 400A will be etched and removed first in order to remove the sacrificial layers 130A of the stack 130 within the core area 400A, followed by the removal of the trench filler material 151 in the GL trench 150 within the stair step area 400B in order to remove the sacrificial layers 130A of the stack 130 within the stair step area 400B.

Figures 8A, 8B, 8C:
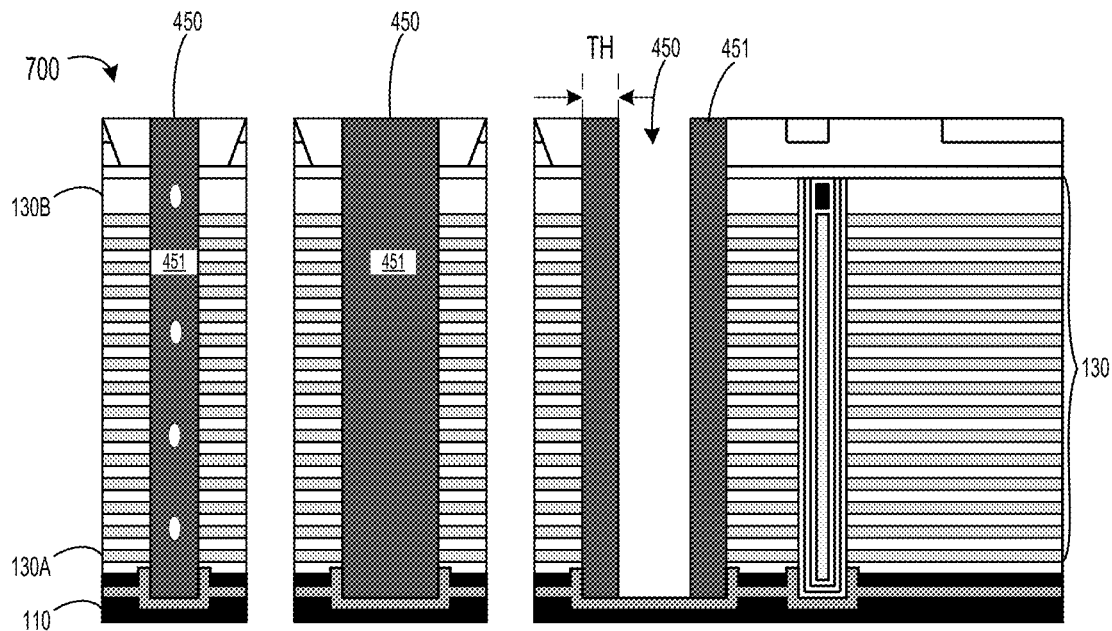
FIGS. 8A-8C are cross-sectional views of various intermediate steps of the method along cut lines AA', BB' and CC' shown in FIG. 7, respectively, corresponding to the intermediate step of the method shown in FIG. 7B.
Figures 9A, 9B, 9C:
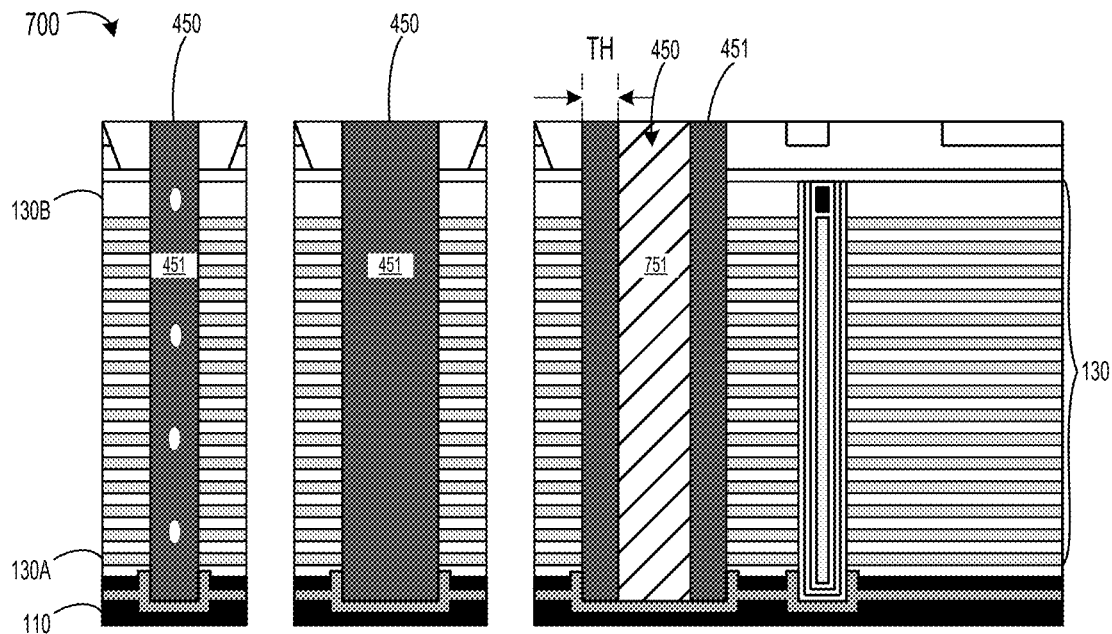
FIGS. 9A-9C are cross-sectional views of various intermediate steps of the method along cut lines AA', BB' and CC' shown in FIG. 7, respectively, corresponding to the intermediate step of the method shown in FIG. 7C.
Figures 10A, 10B, 10C:
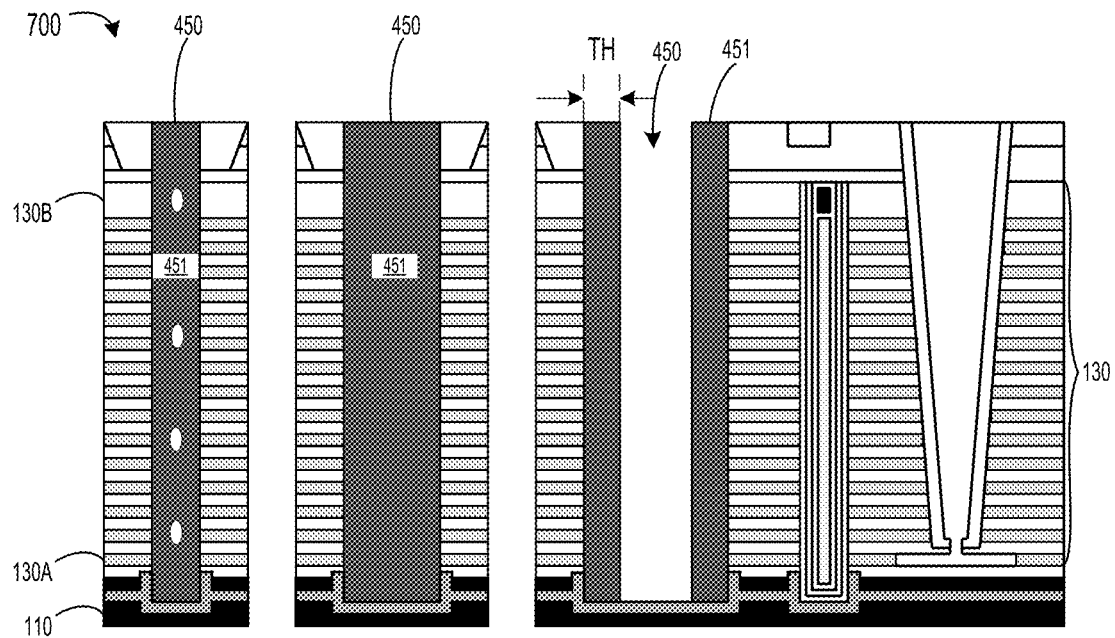
FIGS. 10A-10C are cross-sectional views of various intermediate steps of the method along cut lines AA', BB' and CC' shown in FIG. 7, respectively, corresponding to the intermediate step of the method shown in FIG. 7D.
Figures 11A, 11B, 11C:
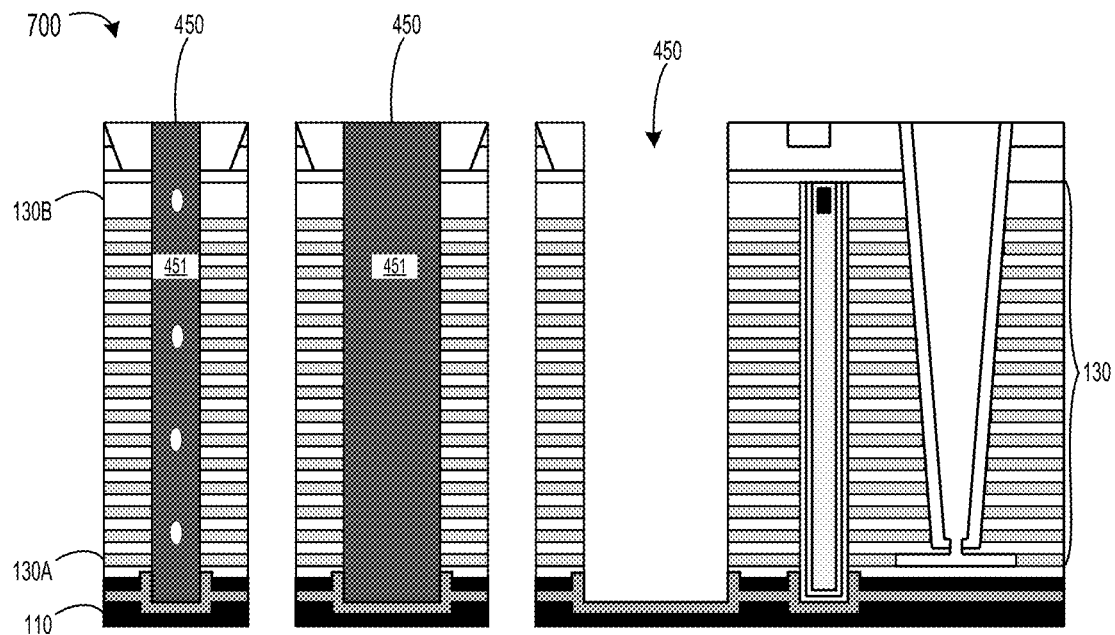
FIGS. 11A-11C are cross-sectional views of various intermediate steps of the method along cut lines AA', BB' and CC' shown in FIG. 7, respectively, corresponding to the intermediate step of the method shown in FIG. 7E.

FIG. 7 is a top view of an exemplary 3D semiconductor structure 700 in accordance with some embodiments of the present disclosure. The 3D semiconductor structure 700 can be used to manufacturing a 3D NAND memory device. The semiconductor structure 700 differs from the semiconductor structure 400 in that the hollow trench filler material 451 in the GL trenches 450 within the stair step area 400B is further filled with a material 751, e.g., carbon 751. FIGS. 7A-7E are enlarged top views of various intermediate steps of a method for filling the GL trenches 450 with the trench filler material 451 and the carbon 751 in accordance with some embodiments of the present disclosure. FIGS. 8A-8C are cross-sectional views of various intermediate steps of the method along cut lines AA', BB' and CC' shown in FIG. 7, respectively, corresponding to the intermediate step of the method shown in FIG. 7B. FIGS. 9A-9C are cross-sectional views of various intermediate steps of the method along cut lines AA', BB' and CC' shown in FIG. 7, respectively, corresponding to the intermediate step of the method shown in FIG. 7C. FIGS. 10A-10C are cross-sectional views of various intermediate steps of the method along cut lines AA', BB' and CC' shown in FIG. 7, respectively, corresponding to the intermediate step of the method shown in FIG. 7D. FIGS. 11A-11C are cross-sectional views of various intermediate steps of the method along cut lines AA', BB' and CC' shown in FIG. 7, respectively, corresponding to the intermediate step of the method shown in FIG. 7E. The filling of the carbon 751 in the GL trenches 450 within the stair step area 400B can be beneficial to subsequent processes. For example, in a lithography process for fabricating SCT openings a photo resist can have the same reflectivity in its entirety, even if a portion of the photo resist is formed over the GL trenches 540, which is filled by the carbon 751.

In the exemplary semiconductor structure 700, the hollow trench filler material 451 in the GL trenches 450 within the stair step area 400B is further filled with the carbon 751, as shown in FIGS. 7C and 9B. When the sacrificial layers 130A of the stack 130 within the stair step area 400B are going to be removed, the carbon 751 can be removed by burning in a plasma ashing process with an oxidant, e.g., oxygen, at approximately 400° C., as shown in FIGS. 7D and 10B. For example, in the plasma ashing process a plasma source is introduced to generate a reactive species, such as oxygen or fluorine, which can combine with the carbon 751 to form ash, which can then be removed with a vacuum pump. Then, the enchant can be applied in the hollow trench filler material 451 in the GL trenches 450 within the stair step area 400B to remove the sacrificial layers 130A of the stack 130 within the stair step area 400B, as shown in FIGS. 7E and 11B.

The high temperature of 400° C. at which the burning of the carbon 751 is performed may damage some components already fabricated. In an embodiment, the carbon 751 can be replaced by a dielectric material, e.g., nitride. The dielectric material can be etched off by acid in one step. In some embodiments, the carbon 751 can be replaced with some other materials, as long as these materials do not interface with the trench filler material 451 and thus can be removed easily by a method well known in the art.

FIGS. 12A-18A are cross-sectional views of various intermediate steps of a method (referred to as a Deposition-Etch-Deposition-Etch-Deposition (D-E-D-E-D) method) for filling the GL trenches 450 of the semiconductor structure 400 with a trench filler material along the cut line AA' shown in FIG. 4 in accordance with some embodiments of the present disclosure. FIGS. 12B-18B are cross-sectional views of various intermediate steps of a method for filling the GL trenches 450 with the trench filler material 1351 along the cut line BB' shown in FIG. 4 in accordance with some embodiments of the present disclosure. After the trench filler material 451 is removed from the GL trenches 450, the empty GL trenches 450 shall be filled with a trench filler material, and no significant seams, holes or cracks are formed in the trench filler material, in order for the semiconductor structure 400 to pass a three-point bending test to guarantee that the semiconductor structure 400 will not break down during a subsequent process, e.g., formation of an SCT in the SCT opening 160.

As shown in FIGS. 12A and 12B, which follow FIGS. 6A and 6B, respectively, the sacrificial layers 130A of the stack 130 within the stair step area 400B and the core area 400A can be removed by an etching process, e.g., a wet etching process, and the insulating layers 130B are uncovered. In an embodiment, all the sacrificial layers 130A of the stack 130 within the core area 400A can be removed. In another embodiment, a desired one of the sacrificial layers 130A within the stair step area 400B that is exposed by the SCT opening 160 can be removed partially, and the others of the sacrificial layers 130A within the stair step area 400B are removed partially. Then, liners, e.g., high-k dielectric layers and, optionally, TiN layers (not shown), can be formed in a conformal deposition process, e.g., an atomic layer deposition (ALD) process, to cover the uncovered insulating layers 130B. A conductive material 1230A, e.g., tungsten (W) can then be deposited to fill the spaces between the insulating layers 130B, which are covered by the high-k dielectric layers and the TiN layers, to form word lines layers 1230A of the semiconductor structure 400. In some embodiments, tungsten (W) can be deposited using a CVD or ALD process, with tungsten hexafluoride ($WF_6$) included in the reaction gas for the CVD or ALD process as the source of tungsten (W). An etching process can further be performed to recess the word line layers 1230A in the horizontal direction, e.g., Y direction, from the sidewalls of the GL trenches 450. Accordingly, gaps 450A can be formed between the sidewalls of the GL trenches 450 and the word line layers 1230A so that the word line layers 1230A can be isolated from one another. When the word line layers 1230A are recessed, a portion of one of the word line layers 1230A (corresponding to the desired sacrificial layer 130A) within the stair step area 400B that is exposed by the SCT opening 160 can also be etched. A dielectric layer, e.g., oxide (not shown), can be formed to cover the word line layers 1230A, the insulating layers 130B and the portion of the word line layer 1230A.

As shown in FIGS. 13A and 13B, a trench filler material 1351 is deposited in the GL trenches 450 for the first time to form a gate line (GL) structure 1351 until a predetermined number of seams or holes 1370, e.g., one seam or hole 1370, is formed in the trench filler material 1351 in the GL trenches 450 within the core area 400A, which are narrower than the GL trenches 450 within the stair step area 400B. In an embodiment, the trench filler material 1351 can be carbon.

As shown in FIGS. 14A and 14B, the trench filler material 1351 in the GL trenches 450 is etched back for the first time until the seam or hole 1370 of the trench filler material 1351 in the GL trenches 450 within the core area 400A is opened.

As shown in FIGS. 15A and 15B, the trench filler material 1351 is deposited in the GL trenches 450 for the second time until another predetermined number of seams or holes 1571, e.g., one seam or hole 1571, is formed in the trench filler material 1351 in the GL trenches 450 within the stair step area 400B. At this stage, the GL trenches 450 within the core area 400A can be fully filled with the trench filler material 1351.

As shown in FIGS. 16A and 16B, the trench filler material 1351 in the GL trenches 450 within the stair step area 400B is etched back for the second time until the seam or hole 1570 of the trench filler material 1351 in the GL trenches 450 within the stair step area 400B is opened.

As shown in FIGS. 17A and 17B, the trench filler material 1351 is deposited in the GL trenches 450 within the stair step area 400B for the third time until the GL trenches 450 within the core area 400A are fully filled with the trench filler material 1351. In an embodiment, the trench filler material 1351 within the SCT opening 160 can be etched and removed, and the liner, e.g., including the high-k dielectric layer and the TiN layer (not shown), and the dielectric layer (not shown), as described with respect to FIGS. 12A and 12B, can be punched to uncover the one of the word line layers 1230A, and a conductive material, e.g., tungsten, can be deposited to fill the SCT opening 160 to form an SCT 1810 that connects the one of the word line layers 1230A. The SCT 1810 thus formed can include a vertical portion 1810A through the stack 130 within the stair step area 400B and a horizontal portion 1810B connected to the bottom end of the vertical portion 1810A at a center thereof and to the one of the word line layers 1230A within the stair step area 400B, as shown in FIGS. 18A and 18B, without any interface formed between the horizontal portion 1810B and the one of the word line layers 1230A. In another embodiment, the trench filler material 1351, the liner and the dielectric layer can be punched to uncover the one of the word line layers 1230A, and a conductive material, e.g., tungsten, can be deposited to fill the SCT opening 160 and connect the one of the word line layers 1230A.

Figure 19:
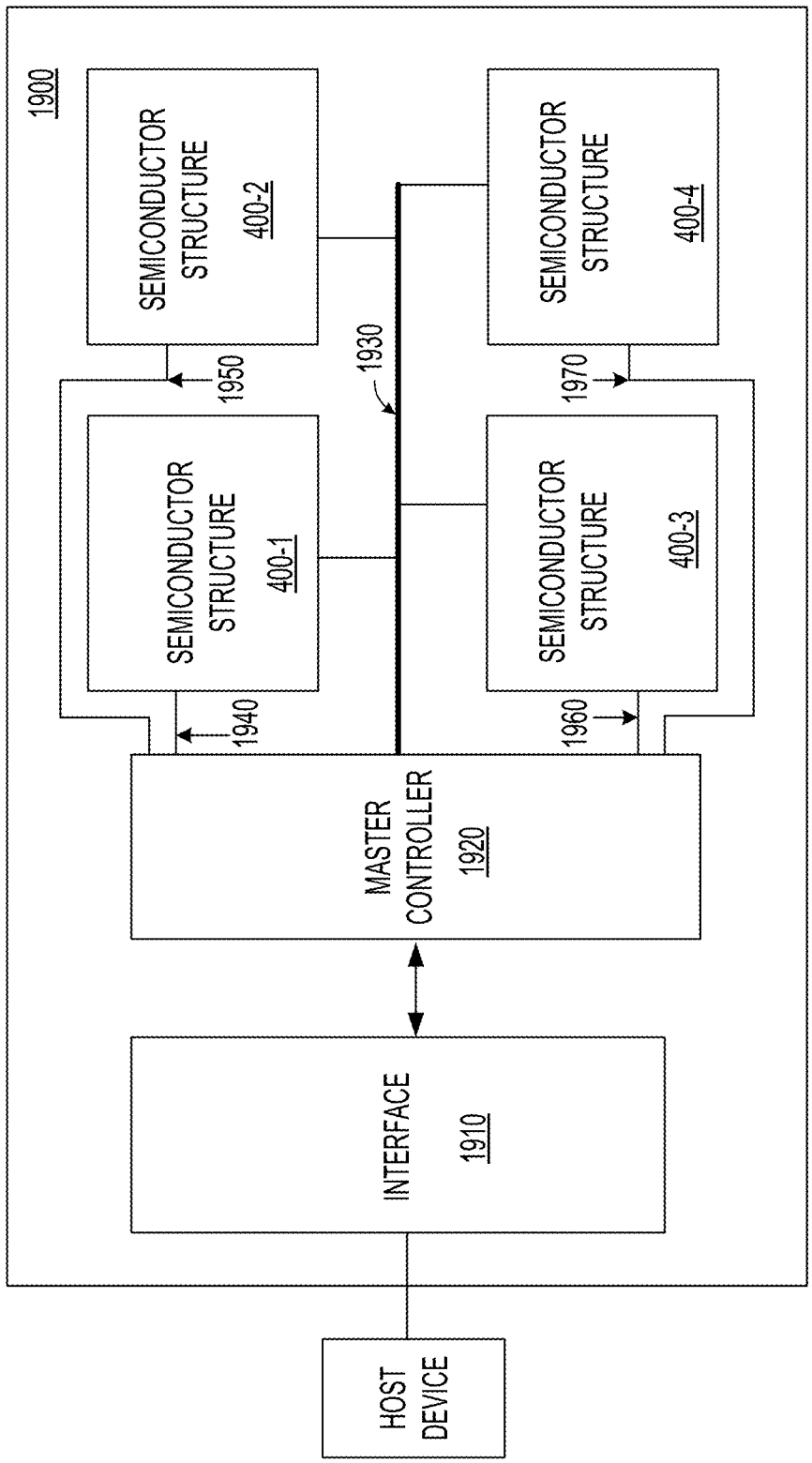
FIG. 19 shows a block diagram of an exemplary memory system in accordance with some embodiments of the present disclosure.

FIG. 19 shows a block diagram of an exemplary memory system 1900 in accordance with some embodiments of the present disclosure. The memory system 1900 can includes one or more semiconductor structures, e.g., the semiconductor structure 400. In some embodiments, the memory system 1900 can be a solid state drive (SSD) or a memory module.

The memory system 1900 can include other suitable components. For example, the memory system 1900 can include an interface (or master interface circuitry) 1910 and a master controller (or master control circuitry) 1920 coupled to each other. The memory system 1900 can also include a bus 1930 that couples the master controller 1920 with the semiconductor structures 400-1 to 400-4. In addition, the master controller 1920 is connected with the semiconductor structures 400-1 to 400-4, respectively, such as shown by respective control lines 1940-1970.

The interface 1910 is suitably configured mechanically and electrically to connect between the memory system 1900 and a host device, and can be used to transfer data between the memory system 1900 and the host device.

The master controller 1920 is configured to connect the respective semiconductor structures 400-1 to 400-4 to the interface 1910 for data transfer. For example, the master controller 1920 can be configured to provide enable/disable signals respectively to the semiconductor structures 400-1 to 400-4 to activate one or more of the semiconductor structures 400-1 to 400-4 for data transfer.

The master controller 1920 is responsible for the completion of various instructions within the memory system 1900. For example, the master controller 1920 can perform bad block management, error checking and correction, garbage collection, and the like. In some embodiments, the master controller 1920 can be implemented using a processor chip. In some examples, the master controller 1920 can be implemented using multiple master control units (MCUs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack of alternating word line layers and insulating layers, the stack including a core area and a stair step area connected to the core area;
   one or more gate line (GL) structures through the word line layers and the insulating layers of the stack, the GL structures extending from the core area to the stair step area, at least one of the GL structures having a first width within the core area and a second width within the stair step area that is different from the first width;
   one or more first channel structures formed through the stack within the core area; and
   one or more stair step contacts (SCTs) each formed through at least a portion of the stack within the stair step area, the SCTs each connecting one of the word line layers of the stack within the stair step area.

2. The semiconductor device of claim 1, wherein the second width is greater than the first width.

3. The semiconductor device of claim 2, wherein the second width is $1^+$-3 times greater than the first width.

4. The semiconductor device of claim 2, further comprising a dummy transition area connected between the stair step area and the core area, wherein the GL structure within the dummy transition area has a width monotonously decreased from a first end connected to the stair step area to a second end connected to the core area.

5. The semiconductor device of claim 1, further comprising:
   another stack of alternating dielectric layers and insulating layers within the stair step area, the another stack of alternating dielectric layers and insulating layers being in contact with the stack of alternating word line layers and insulating layers within the stair step area.

6. The semiconductor device of claim 5, wherein each layer of the another stack of alternating dielectric layers and insulating layers is in line with a corresponding layer of the stack of alternating word layers and insulating layers.

7. The semiconductor device of claim 1, wherein the SCTs each includes a vertical portion through the portion of the stack within the stair step area and a horizontal portion connected to a bottom end of the vertical portion at a center thereof and to one of the word line layers within the stair step area that the portion of the stack reaches.

8. A method, comprising:
   providing a stack of alternating sacrificial layers and insulating layers over a substrate, the stack including a core area and a stair step area connected to the core area;
   forming one or more gate line (GL) trenches through the sacrificial layers and the insulating layers of the stack extending from the core area to the stair step area; and
   filling the GL trenches with a first trench filler material such that the first trench filler material in at least one of the GL trenches within one of the core area and the stair step area is hollow.

9. The method of claim 8, wherein the GL trench within the other of the core area and the stair step area is fully filled by the first trench filler material.

10. The method of claim 8, wherein the GL trench has a first width within the one of the core area and the stair step area and a second width within the other of the core area and the stair step area that is different from the first width.

11. The method of claim 10, wherein the second width is less than the first width.

12. The method of claim 11, further comprising:
    removing the first trench filler material in the GL trench within the one of the core area and the stair step area; and
    removing and replacing a portion of the sacrificial layers of the stack within the one of the core area and the stair step area with a first conductive layer.

13. The method of claim 12, wherein the one of the core area and the stair step area is the stair step area, and the method further comprises:
    forming within the stair step area a stair step contact (SCT) through at least a portion of the stack that connects the first conductive layer.

14. The method of claim 13, further comprising:
    removing the first trench filler material in the GL trench within the core area; and
    removing and replacing the sacrificial layers of the stack within the core area with a second conductive layer.

15. The method of claim 14, further comprising:
    filling the GL trench within the core area and the stair step area with a second trench filler material.

16. The method of claim 15, wherein filling the GL trench within the core area and the stair step area with the second trench filler material includes:
    filling the second trench filler material in the GL trench until a first predetermined number of holes is formed in the second trench filler material in the GL trench within the core area;
    etching back the second trench filler material in the GL trench until the first predetermined number of holes is opened;
    filling the second trench filler material in the GL trench until a second predetermined number of holes is formed in the second trench filler material in the GL trench within the stair step area;
    etching back the second trench filler material in the GL trench within the stair step area until the second predetermined number of holes is opened; and
    filling the second trench filler material in the GL trench within the stair step area.

17. The method of claim 13, wherein the SCT is formed by:
- forming within the stair step area an SCT opening through the portion of the stack to uncover lateral sides of the insulating layers and the sacrificial layers of the portion of the stack and one of the sacrificial layers that the portion of the stack reaches;
- forming a spacer that covers the lateral sides of the insulating layers and the sacrificial layers;
- removing a portion of the one of the sacrificial layers to form a space;
- forming a liner to cover the spacer and fill the space;
- removing the sacrificial layers of the stack within the stair step area;
- replacing the sacrificial layers of the stack within the core area and a portion of the sacrificial layers within the stair step area with the first conductive layer; and
- filling a metal material in the space and the SCT opening to connect the first conductive layer.

18. The method of claim 8, further comprising:
- filling the hollow first trench filler material with a second trench filler material.

19. The method of claim 18, wherein the second trench filler material does not interface with the first trench filler material.

20. A memory system, comprising:
- a semiconductor device, including:
  - a stack of alternating word line layers and insulating layers, the stack including a core area and a stair step area connected to the core area;
  - one or more gate line (GL) structure through the word line layers and the insulating layers of the stack extending from the core area to the stair step area, at least one of the GL structures having a first width within the core area and a second width within the stair step area that is different from the first width;
  - one or more first channel structures formed through the stack within the core area; and
  - one or more stair step contacts (SCTs) each formed through at least a portion of the stack within the stair step area, the SCTs each connecting one of the word line layers of the stack within the stair step area; and
- control circuitry coupled to the semiconductor device, the control circuitry configured for controlling operations of the semiconductor device.

* * * * *